(12) United States Patent
Okuma

(10) Patent No.: US 11,610,623 B2
(45) Date of Patent: Mar. 21, 2023

(54) APPARATUS WITH A ROW-HAMMER ADDRESS LATCH MECHANISM

(71) Applicant: Micron Technology, Inc., Boise, ID (US)

(72) Inventor: Sadayuki Okuma, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/168,049

(22) Filed: Feb. 4, 2021

(65) Prior Publication Data

US 2021/0158862 A1 May 27, 2021

Related U.S. Application Data

(62) Division of application No. 16/234,397, filed on Dec. 27, 2018, now Pat. No. 10,943,637.

(51) Int. Cl.
  *G11C 11/406* (2006.01)
  *G06F 12/06* (2006.01)
  *G11C 11/408* (2006.01)

(52) U.S. Cl.
  CPC .... *G11C 11/40611* (2013.01); *G06F 12/0646* (2013.01); *G11C 11/406* (2013.01); *G11C 11/408* (2013.01); *G06F 2212/1008* (2013.01)

(58) Field of Classification Search
  None
  See application file for complete search history.

(56) References Cited

U.S. PATENT DOCUMENTS

| | | | |
|---|---|---|---|
| 5,829,051 A | 10/1998 | Steely et al. | |
| 9,690,505 B2 | 6/2017 | Benedict | |
| 9,805,782 B1* | 10/2017 | Liou | G11C 11/4085 |
| 2014/0334225 A1* | 11/2014 | Cordero | G11C 11/40603 |
| | | | 365/149 |
| 2014/0369109 A1* | 12/2014 | Lee | G11C 11/408 |
| | | | 365/149 |
| 2015/0155025 A1* | 6/2015 | Lee | G11C 11/40611 |
| | | | 365/222 |
| 2015/0200002 A1* | 7/2015 | Lin | G11C 11/40618 |
| | | | 711/106 |
| 2016/0246525 A1 | 8/2016 | Jeffrey et al. | |
| 2017/0076779 A1 | 3/2017 | Bains et al. | |
| 2017/0287547 A1 | 10/2017 | Ito et al. | |
| 2018/0025770 A1 | 1/2018 | Ito et al. | |
| 2019/0122722 A1 | 4/2019 | Yamada et al. | |

(Continued)

FOREIGN PATENT DOCUMENTS

WO 2017175392 A1 10/2017

OTHER PUBLICATIONS

International Application No. PCT/US2019/045056—International Search Report and Written Opinion, dated Nov. 22, 2019, 12 pages.

*Primary Examiner* — J. H. Hur
(74) *Attorney, Agent, or Firm* — Perkins Coie LLP

(57) ABSTRACT

A refresh tracking circuit and associated methods are disclosed herein. The tracking circuit may be configured to track a primary count value and a secondary count value based on addresses associated with received commands. The primary and secondary count values may be configured to control corresponding refresh operations respectively associated with a primary address and a secondary address.

21 Claims, 9 Drawing Sheets

(56) References Cited

U.S. PATENT DOCUMENTS

| | | | |
|---|---|---|---|
| 2019/0130959 A1* | 5/2019 | Moon | G11C 11/406 |
| 2019/0348107 A1* | 11/2019 | Shin | G11C 11/4082 |
| 2019/0385667 A1 | 12/2019 | Morohashi et al. | |
| 2020/0090729 A1* | 3/2020 | Son | G11C 11/406 |
| 2020/0211632 A1* | 7/2020 | Noguchi | G11C 11/40622 |
| 2020/0211633 A1 | 7/2020 | Okuma | |
| 2020/0219555 A1* | 7/2020 | Rehmeyer | G11C 11/4087 |

* cited by examiner

APPARATUS WITH A ROW-HAMMER ADDRESS LATCH MECHANISM

CROSS-REFERENCE TO RELATED APPLICATION(S)

This application is a division of U.S. patent application Ser. No. 16/234,397, filed Dec. 27, 2018; which is incorporated herein by reference in its entirety.

TECHNICAL FIELD

The disclosed embodiments relate to devices, and, in particular, to semiconductor memory devices with a row-hammer address latch mechanism.

BACKGROUND

An apparatus (e.g., a processor, a memory system, etc.) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data. For example, the memory devices can include Double Data Rate (DDR) RAM devices that implement DDR interfacing scheme (e.g., DDR4, DDR5, etc.) for high-speed data transfer.

In operating the memory devices, an address may be repeatedly accessed, such as in a successive manner, in a relatively short amount of time. Repeatedly accessing (e.g., activating/deactivating) a word line (e.g., an aggressor word line) can cause a row hammer effect, where the charges stored in adjacent or nearby word lines (i.e., victim word lines) are degraded as a result of the repeated or successive access of the aggressor word line. To offset the degradation, the memory devices can identify row hammer events and the associated aggressor word lines during operation. Based on the identification, the memory devices can execute row hammer refresh (RHR) operations to restore (e.g., compensate for the loss by recharging) the charge levels of the corresponding victim word lines.

With technological advancements in other areas and increasing applications, the market is continuously looking for faster, more efficient, and smaller devices. To meet the market demand, the semiconductor devices are being pushed to the limit. Accordingly, the memory devices are decreasing in size and/or increasing in density, thereby causing memory cells in the devices to be physically smaller. As a result, the memory cells store less charges, which in turn reduces operational noise margins and increases electromagnetic interactions between the memory cells. This generally leads to greater possibility of data loss, and with respect to row hammer effects, increases the likelihood of loss in data lines beyond the immediately adjacent (i.e., abutting) victim word lines.

In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

DETAILED DESCRIPTION

As described in greater detail below, the technology disclosed herein relates to an apparatus, such as memory systems, systems with memory devices, related methods, etc., for managing refresh operations including row hammer refresh (RHR) operations. The apparatus (e.g., DRAM devices) can manage the RHR operations by detecting a row hammer event and identifying an associated aggressor word line (e.g., the word line that has been repeatedly accessed over a threshold amount of times) during operation of the apparatus. Based on the aggressor word line, the apparatus can identify victim word lines (e.g., word lines abutting or immediately adjacent to the aggressor word lines) where the stored charges are likely degraded by the row hammer event. Accordingly, the apparatus can execute the RHR operations (e.g., recharging operations) to refresh the charge levels of the victim word lines.

In addition to refreshing the abutting victim word lines ("primary victim word lines"), the apparatus can identify and refresh additional refresh word lines that may be negatively affected by the row hammer event. For example, as device sizes decrease and/or memory densities increase, the physical separation between memory cells may decrease and/or the charges stored in each cell may decrease (i.e., due to smaller memory cells). As a result, the row hammer event may affect more than one set of word lines surrounding the aggressor word line. Thus, in some embodiments, the apparatus can additionally identify and refresh word lines ("secondary victim word lines") abutting or immediately adjacent to the primary victim word lines opposite the aggressor word line. In some embodiments, as further described below, the apparatus can include a double stage row hammer address latch circuit configured to identify and track the secondary victim word lines for the RHR operations.

Figure 1:
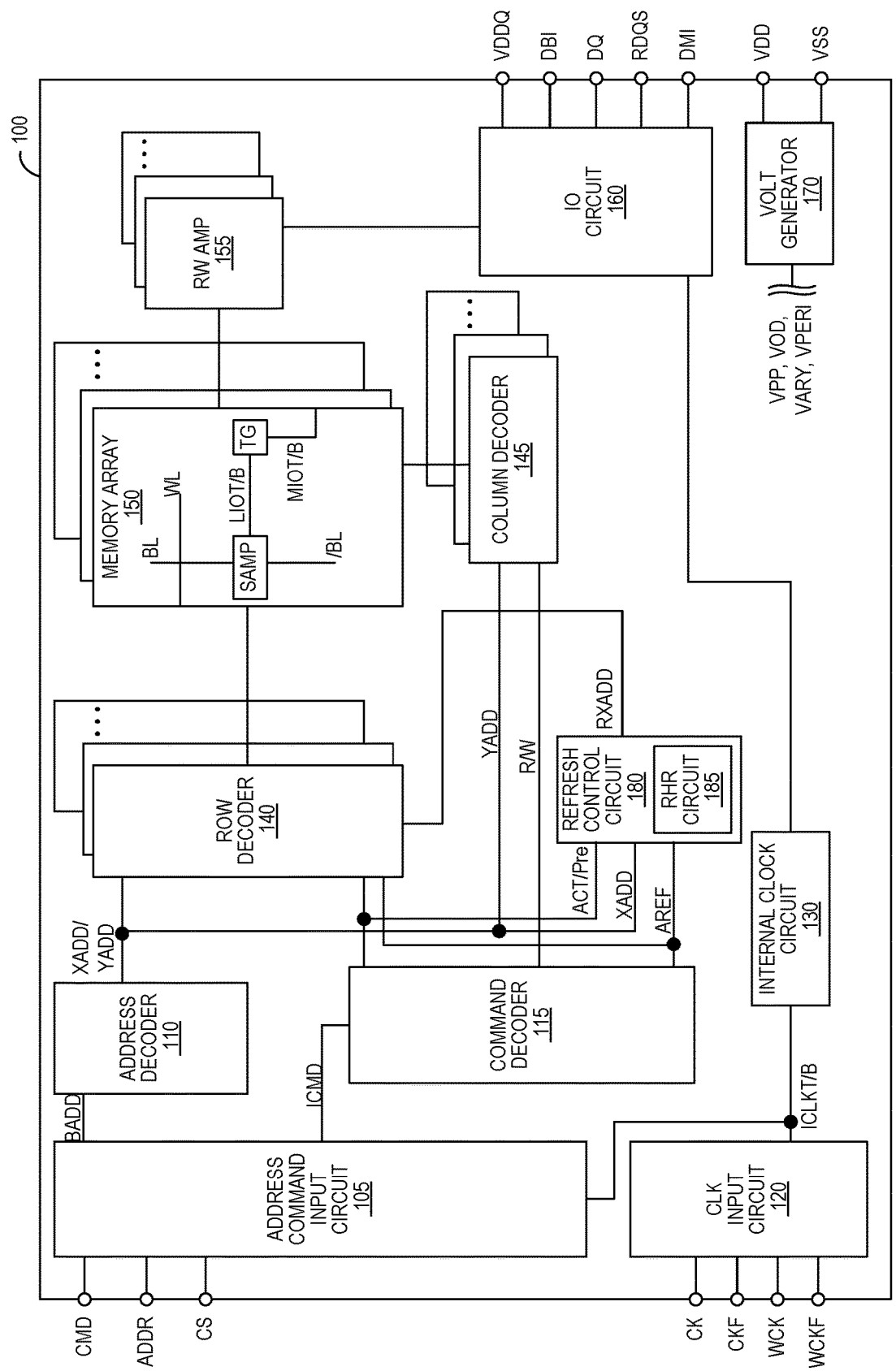
FIG. 1 is a block diagram of an apparatus in accordance with an embodiment of the present technology.

FIG. 1 is a block diagram of an apparatus 100 (e.g., a semiconductor die assembly, including a 3DI device or a die-stacked package) in accordance with an embodiment of the present technology. For example, the apparatus 100 can include a DRAM (e.g., DDR3 DRAM, DDR4 DRAM, DDR5 DRAM, etc.), or a portion thereof that includes one or more dies/chips. In some embodiments, the apparatus 100 can include synchronous DRAM (SDRAM) of DDR type integrated on a single semiconductor chip.

The apparatus 100 may include an array of memory cells, such as memory array 150. The memory array 150 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 1) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller. The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register (not shown in FIG. 1). The write latency WL information can be defined in terms of clock cycles of the CK clock signal. For example, the write latency information WL can be a number of clock cycles of the CK signal after the write command is received by the apparatus 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1) from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator and thus various internal clock signals can be generated.

The apparatus 100 can be connected to any one of a number of electronic devices capable of utilizing memory for the temporary or persistent storage of information, or a component thereof. For example, a host device of apparatus 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100, although in other embodiments, the host device may be indirectly connected to memory device (e.g., over a networked connection or through intermediary devices).

The apparatus 100 can include a refresh control circuit 180 configured to control refreshing of the information of the corresponding memory cell MC. For example, as inputs, the refresh control circuit 180 can receive the decoded row address signal (XADD) from the address decoder 110, a refresh signal (AREF) from the command decoder 115, an active signal (ACT) and/or a precharge signal (Pre) from the command decoder 115, etc. The command decoder 115 can generate the active signal (ACT) (e.g., a pulse signal) when the command signals (CMD) indicates row access (e.g., active command). The command decoder 115 can generate the precharge signal (Pre) (e.g., a pulse signal) when the command signal (CMD) indicates pre-charge. The command decoder 115 can generate the refresh signal (AREF) (e.g., a pulse signal) when the command signal (CMD) indicates an auto-refresh command and/or a self-refresh entry command. In response to the self-refresh entry command, the refresh signal (AREF) can be activated cyclically at a desired interval until a self-refresh exit command is received. In some embodiments, in response to the refresh signal (AREF), the refresh control circuit 180 can generate a refresh row address (RXADD) to the row decoder 140, which initiates the refresh operation therein (e.g., by activating a predetermined word line in the memory cell array. Accordingly, the apparatus 100 can implement a refresh operation (e.g., scheduled refreshes) to refresh (e.g., increase stored charges) targeted locations (e.g., primary victim word lines and/or secondary victim word lines).

The refresh control circuit 180 can include a RHR control circuit 185 configured to control the RHR operation. The RHR control circuit 185 can be configured to control the RHR operation and refresh one or more sets of word lines that are adjacent to hammered word lines. For example, the refresh control circuit 180 can generate the refresh row address (RXADD) that corresponds to the primary victim word lines abutting the aggressor word line and/or secondary victim word lines that abut the primary victim word lines. In some embodiments, the RHR control circuit 185 can steal one or more pumps (e.g., predetermined durations or number of clock cycles for refreshing a word line or a set of cells) from the overall scheduled refresh operation to execute the RHR operations. For example, the apparatus 100 can refresh the primary victim word lines and/or the secondary victim word lines during the stolen pumps.

Figure 2:
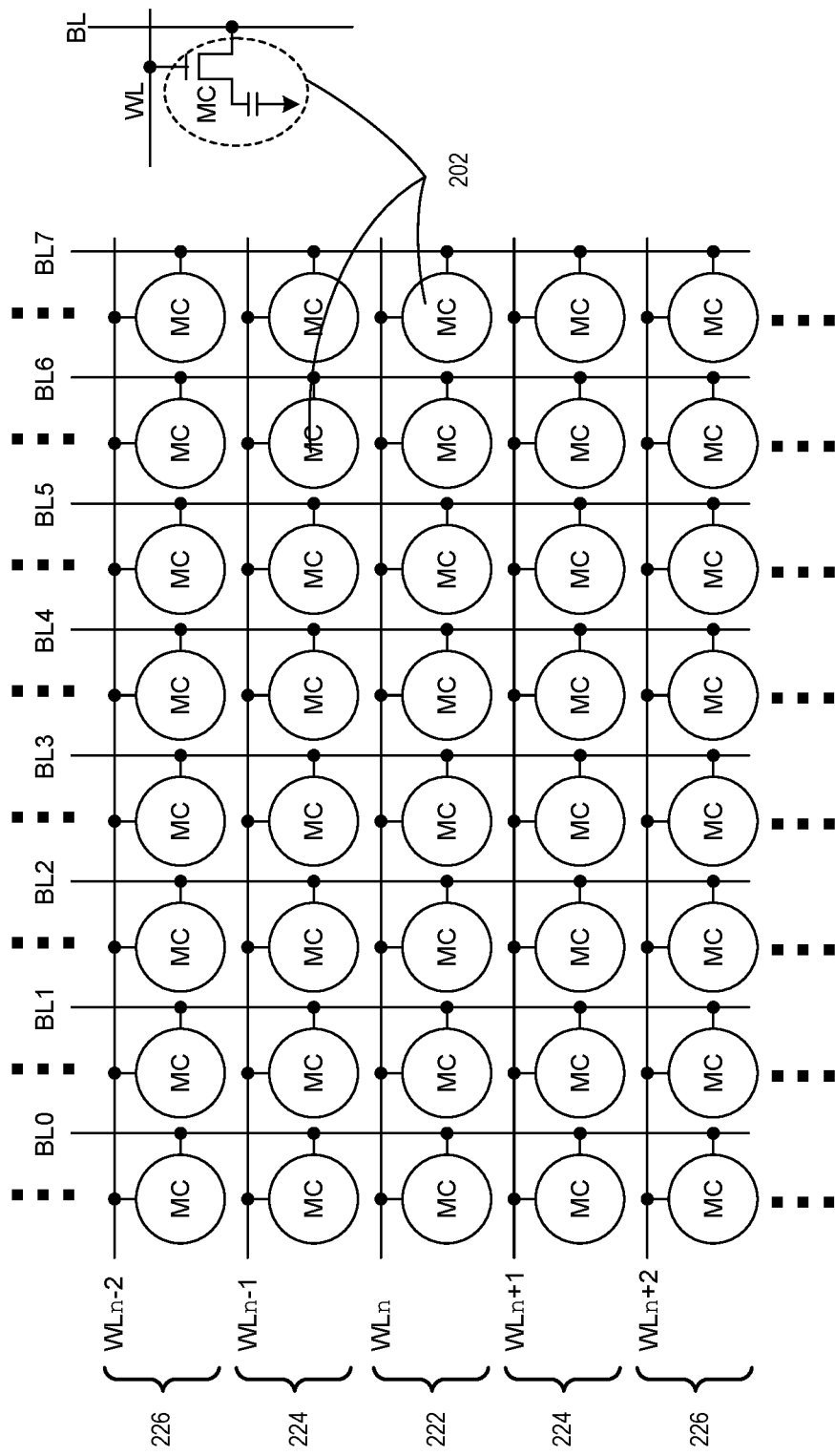
FIG. 2 is an example circuit diagram of a memory array in accordance with an embodiment of the present technology.

FIG. 2 is an example circuit diagram of a memory array (e.g., the memory array 150 of FIG. 1) in accordance with an embodiment of the present technology. As described above, the memory array 150 includes memory cells 202 arranged according to word lines (e.g., rows of the memory cells 202) and bit lines (e.g., columns of the memory cells 202).

During operation the apparatus 100 of FIG. 1, the RHR control circuit 185 of FIG. 1 can detect a row hammer event when an aggressor word line 222 is repeatedly accessed (e.g., activated/deactivated over a threshold number of times). The row hammer event can deplete the charges stored on adjacent or nearby cells. FIG. 2 illustrates the aggressor word line 222 in relation to primary victim word lines 224 and secondary victim word lines 226 that may be affected by the row hammer event. With the aggressor word line 222 in the middle, the primary victim word lines 224 can include the word lines that are abutting or immediately adjacent to the aggressor word line 222. The secondary victim word lines 226 can include the word lines that abut the primary victim word lines 224 opposite the aggressor word line 222. In other words, the primary victim word lines 224 can include a pair of word lines that surround the aggressor word line 222. Further, the primary victim word lines 224 can include the word lines that are between the aggressor word line 222 and the secondary victim word lines 226. For example, for the aggressor word line $WL_n$, the primary victim word lines 224 can include word lines $WL_{n-1}$ and $WL_{n+1}$, and the secondary victim word lines 226 can include word lines $WL_{n-2}$ and $WL_{n+2}$.

Also, during operation, the apparatus 100 can periodically issue (via, e.g., the command decoder 115 of FIG. 1) and execute (e.g., via, e.g., the refresh control circuit 180 of FIG. 1) refresh commands. Accordingly, the refresh control circuit 180 can refresh word lines in a scheduled manner to prevent loss of information due to degradation of the charges stored in the memory cells 202. In some embodiments, the apparatus 100 can issue the refresh commands at a frequency/pattern such that all of the word lines are refreshed at least once during a predetermined refresh cycle (e.g., 64 msec).

However, in some use cases, the scheduled refresh operations may not be implemented at the primary victim word lines 224 and/or the secondary victim word lines 226 until an access count (e.g., the number of activation/deactivations) for the aggressor word line 222 reaches a predetermined threshold. For example, the memory cells 202 coupled to the primary victim word lines 224 can be required to be refreshed via the RHR operation if none of scheduled refresh operations refresh the primary victim word lines 224 until the access count of the aggressor word line 222 reaches a first predetermined number (e.g., 10,000). To execute the RHR operation for the primary victim word lines 224, the RHR control circuit 185 can steal the refresh command issued after detection of the row hammer condition and refresh the primary victim word lines 224 instead of or in addition to the scheduled refresh of the word line that is designated by the content of a CBR (refresh) counter at the time of the refresh command.

Similarly, the memory cells 202 coupled to the secondary victim word lines 226 can be required to be refreshed via the RHR operation if none of scheduled refresh operations refresh the secondary victim word lines 226 until the access count of the aggressor word line 222 reaches a second predetermined number (e.g., 100,000 or greater). Since the row hammering effect decreases as the distance increases between the aggressor word line 222 and the victim word lines, the second predetermined number can be greater than the first predetermined number. In some embodiments, the second predetermined number can be greater than the first predetermined number by one or more orders of magnitude. When the RHR condition for the secondary victim word lines 226 is satisfied, the RHR control circuit 185 can steal the refresh command issued after detection of the row hammer condition and refresh the secondary victim word lines 226 instead of or in addition to the scheduled refresh of the word line that is designated by the content of the CBR counter at the time of the refresh command. Details of the RHR control circuit 185, such as for identifying the RHR condition and/or for implementing the RHR operation for the secondary victim word lines 226, is described below.

Figure 3:
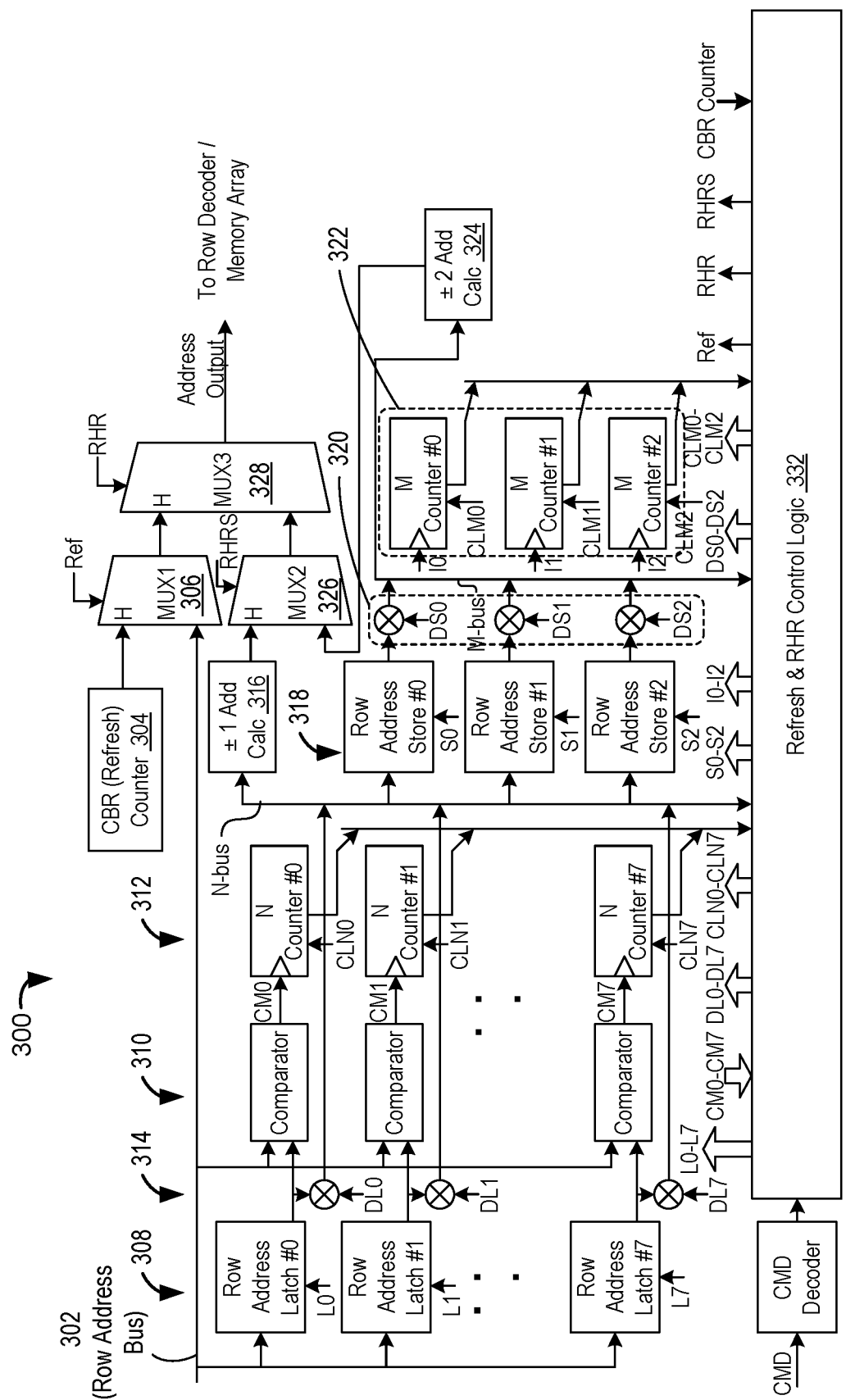
FIG. 3 is a schematic block diagram of an apparatus in accordance with an embodiment of the present technology.

FIG. 3 is a schematic block diagram of an apparatus (e.g., the apparatus 100 of FIG. 1) in accordance with an embodiment of the present technology. For example, the apparatus 100 can include a memory device (e.g., a DRAM device) in accordance with an embodiment of the present technology. In some embodiments, the apparatus 100 can include a control circuit 300 (e.g., a portion of the RHR control circuit 185 of FIG. 1) configured to control the RHR operation and/or provide refresh addresses (RXADD) to the memory array 150 of FIG. 1.

In some embodiments, the control circuit 300 can include a row address bus 302 and/or a refresh counter 304. The row address bus 302 can include a set of electrical connections (e.g., wires) that communicate signals corresponding to a row address (command address) that accompanies a read or a write command. For example, the row address bus 302 can connect the address decoder 110 of FIG. 1 to one or more components of the control circuit 300. The refresh counter 304 can include a CBR counter configured to provide a row address (scheduled refresh address) for the scheduled refresh operation. Accordingly, in executing a refresh command for the scheduled refresh, the apparatus 100 can refresh the memory cells corresponding to the scheduled refresh address provided by the refresh counter 304.

The control circuit 300 can include a command-refresh multiplexer 306 configured to receive the command address from the row address bus 302 and the scheduled refresh address from the refresh counter 304. The command-refresh multiplexer 306 can select one of the received signals according to a refresh signal (Ref). In some embodiments, for example, the command-refresh multiplexer 306 can select the command address when the refresh signal is at a level (e.g., an inactive level or a low level) corresponding to execution of commands other than the refresh command. When the refresh signal is at a complementary level (e.g., an active level or a high level), the command-refresh multiplexer 306 can select the scheduled refresh address provided by the refresh counter 304.

In some embodiments, the control circuit 300 can include a set of row address latches 308a-308i (e.g., up to i-number of latches) configured to latch the row address on the row address bus 302. The row address latches can latch according to a latch pulse (L). The latched addresses can be provided to a set of corresponding comparators 310a-310i. Each comparator can compare the command address from the row address bus 302 to the latched address from the connected latch. When the command address matches the latched address, the corresponding comparator can generate a match signal (CM). The control circuit 300 can include a set of primary counters 312a-312i configured to count the number/occurrence of the match signal. The primary counters 312a-312i can include an up-counter or a down-counter. The primary counters 312a-312i can be reset and the counter values can be cleared to an initial value in response to a clear signal (CLN). Accordingly, using the row address latches 308a-308i, the comparators 310a-310i, and the primary counters 312a-312i, the control circuit 300 can count the number of times certain (e.g., latched) addresses are accessed.

The row address latches 308a-308i can be connected to primary buffers 314a-314i, respectively. The primary buffers 314a-314i can be configured to provide the corresponding latched address to a primary row-hammer bus (N-bus) in response to a primary buffer control (DL) signal. The primary row-hammer bus can provide the latched address (e.g., for the aggressor word line 222 of FIG. 2 when the corresponding primary counter reaches a threshold) to a primary address calculator 316. The primary address calculator 316 can calculate the adjacent addresses (e.g., for the primary victim word lines 224 of FIG. 2) based on the provided address. For example, the primary address calculator 316 can calculate the adjacent addresses based on increasing and/or decreasing provided address by one row/word line.

In some embodiments, the control circuit 300 can further include circuits configured to calculate the secondary victim word lines 226 of FIG. 2. For example, the control circuit 300 can include a set of address storage circuits 318a-318j. In some embodiments, i can be same as or different from j. The address storage circuits 318a-318j can be configured to store the row address on the primary row-hammer bus in response to a store signal (S). The stored row address can be provided to a set of corresponding secondary buffers 320a-320j that are configured to provide the stored row address to a secondary row-hammer bus (M-bus) in response to a secondary latch signal (DS).

The control circuit 300 can include a set of secondary counters 322a-322j (e.g., up-counters or down-counters) connected to the secondary row-hammer bus and configured to increment a counter value in response to an update signal (I). The secondary counters 322a-322j can reset the counter value to an initial value in response to a secondary clear signal CLM.

The control circuit 300 can further include a secondary address calculator 324 connected to the secondary row-hammer bus. The secondary address calculator 324 can be configured to calculate addresses (e.g., for the secondary victim word lines 226) that are two places/rows away from the address (e.g., for the aggressor word line 222) provided on the secondary row-hammer bus. For example, when the corresponding secondary counter reaches a threshold, the secondary address calculator 324 can calculate the secondary set of addresses based on increasing and/or decreasing provided address by two row/word line.

The control circuit 300 can include a set of selectors configured to select one or more addresses appropriate for a command and/or a current condition for the apparatus 100. In some embodiments, for example, the control circuit 300 can include a primary-secondary multiplexer 326 and/or a row-hammer multiplexer 328.

The primary-secondary multiplexer 326 can be connected to outputs of the primary address calculator 316 and the secondary address calculator 324. The primary-secondary multiplexer 326 can be configured to select the adjacent addresses (e.g., the primary victim word lines 224) or the secondary address (e.g., the secondary victim word lines 226) according to a RHR selection (RHRS) signal. For example, the primary-secondary multiplexer 326 can select the adjacent addresses when the RHRS signal is high or active for executing the RHR operations for the primary victim word lines 224. Also, the primary-secondary multiplexer 326 can select the secondary addresses when the RHRS is low or inactive for executing the RHR operations for the secondary victim word lines 226.

The row-hammer multiplexer 328 can be connected to the outputs of the command-refresh multiplexer 306 and the row-hammer multiplexer 328. The row-hammer multiplexer 328 can be configured to select one of the outputs according to a RHR signal that represents whether the RHR is to be executed. For example, the row-hammer multiplexer 328 can select the output (e.g., either the command address or the CBR address) of the command-refresh multiplexer 306 when the RHR signal is high/active for representing when RHR operation is not applicable. Also, the row-hammer multiplexer 328 can select the output (e.g., either the primary victim word lines 224 or the secondary victim word lines 226) of the row-hammer multiplexer 328 when the RHR signal is low/inactive for representing when RHR operation is applicable. The selected address (RXADD) can be provided from the row-hammer multiplexer 328 to the row decoder 140 of FIG. 1 that is configured to decode the output to select the specified word line(s) in the memory array 150 of FIG. 1.

The control circuit 300 can further include a refresh control logic 332. The refresh control logic 332 is configured to control the operations of the control circuit 300. For example, the refresh control logic 332 can control the operation of one or more of the circuits/components described above for the control circuit 300. The refresh control logic 332 can receive and evaluate one or more signals, such as the comparator outputs, the counter values for the primary counters 312a-312i and/or the secondary counters 322a-322i, the CBR counter value, or a combination thereof. Based on the received signals, the refresh control logic 332 can control or issue the latch pulses (L), one or more reset signals (e.g., CLN and/or CLM), one or more buffer control signals (e.g., DL and/or DS), one or more storage signals (S), the update signal (I), or a combination thereof. Also, the refresh control logic 332 can control or issue the multiplexer control signals (e.g., Ref, RHRS, and/or RHR) according to predetermined timings and/or one or more counter values. For example, the refresh control logic 332 can be supplied with decoded command information for recognizing the command issued and/or executed. Also, the refresh control logic 332 receive the CBR counter value for tracking the row addresses that have been refreshed based on each refresh command. Once corresponding addresses have been refreshed, the refresh control logic 332 can issue the reset commands.

In some embodiments, the row address bus 302, the refresh counter 304, the row address latches 308a-308i, the comparators 310a-310i, the primary counters 312a-312i, the primary buffers 314a-314i, and/or the primary address calculator 316 can correspond to a primary RHR circuitry grouping configured to count and process the addresses for calculating the primary victim word lines 224. In addition to the primary RHR circuitry grouping, the control circuit 300 can include a secondary RHR circuitry grouping that is configured to count and process the addresses for calculating the secondary victim word lines 226. For example, the secondary RHR circuitry grouping can include the address storage circuits 318a-318j, the secondary buffers 320a-320j, the secondary counters 322a-322j, and/or the secondary address calculator 324. Since the row-hammer effect will decrease for the secondary victim word lines 226, the control circuit would need the secondary RHR circuitry grouping that is configured differently than the primary RHR circuitry grouping to increase the overall efficiency of the apparatus 100. Further, to account for the addresses for the secondary victim word lines 226 in addition to those of the primary victim word lines 224, the control circuit 300 can include the primary-secondary multiplexer 326 between the command-refresh multiplexer 306 and the row-hammer multiplexer 328.

Figure 4:
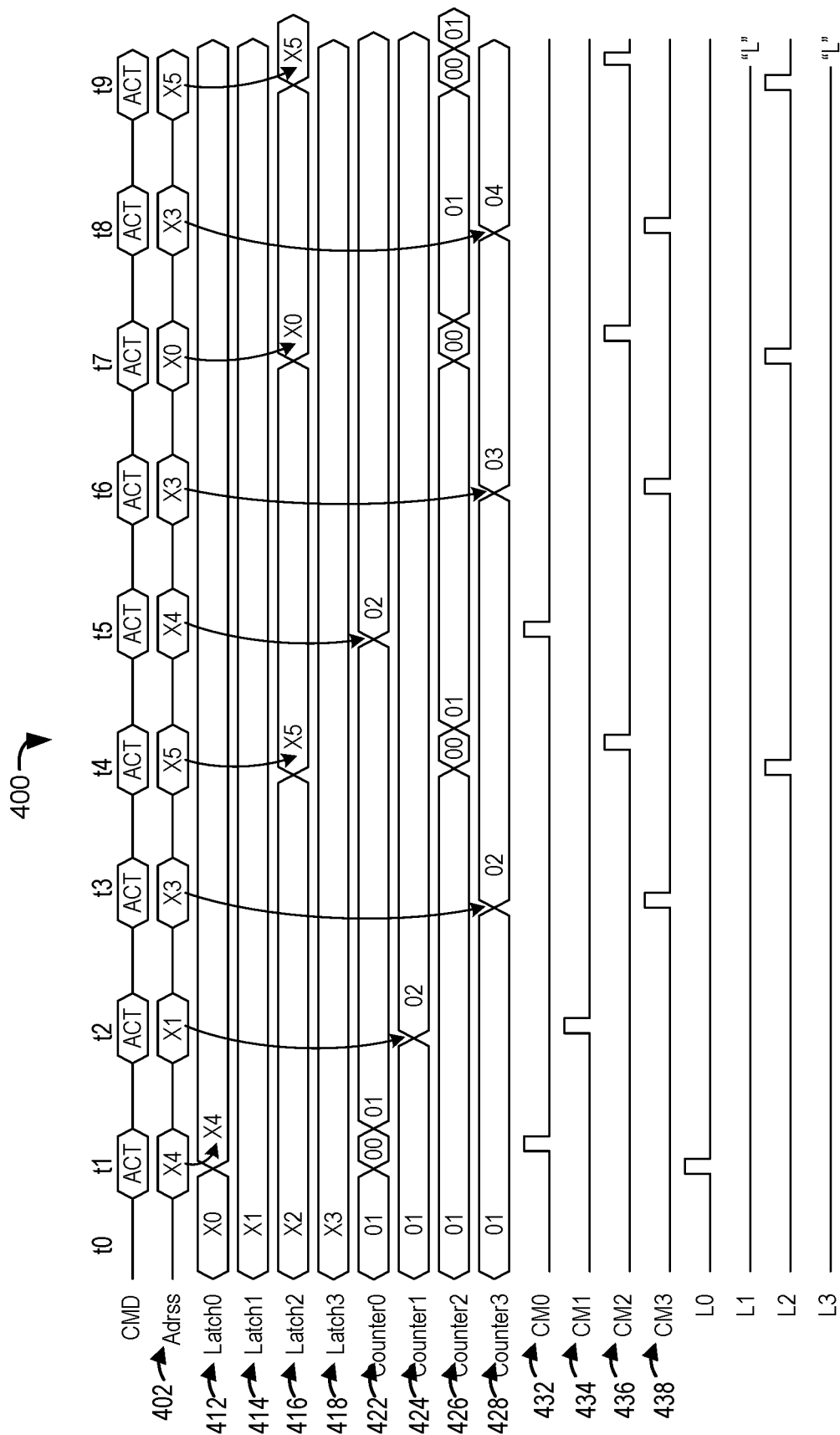
FIG. 4 is a timing diagram illustrating a latching and counting operation for an apparatus in accordance with an embodiment of the present technology.

FIG. 4 is a timing diagram 400 illustrating a latching and counting operation for an apparatus (e.g., the apparatus 100 of FIG. 1) in accordance with an embodiment of the present technology. For example, the timing diagram 400 can illustrate operations of the control circuit 300 of FIG. 3, such as for the row address bus 302 of FIG. 3, the row address latches 308a-308i of FIG. 3 and/or the primary counters 312a-312i of FIG. 3, for the latching and counting operation. The timing diagram 400 can illustrate the process of latching the row addresses from the row address bus 302 to each of the row address latches 308a-308i in response to respective Activation (ACT) commands.

For illustrative purposes, FIG. 4 shows the latching and counting operation for four row address latches, but it is understood that the apparatus 100 can include a different number of row address latches that operate similarly as described below. Also, for illustrative purposes, FIG. 4 illustrates the operation with respective up-counters, but it is understood that the apparatus 100 can utilize down-counters.

As described above, the row address bus 302 can communicate a command address 402 that accompanies the ACT command. The control circuit 300 (via, e.g., one or more of the comparators 310a-310i of FIG. 3 and/or the refresh control logic 332 of FIG. 3) can evaluate whether the command address 402 matches any of the addresses latched on the row address latches. For example, the control circuit 300 can include a first latch (Latch0) for storing a first latched address 412, a second latch (Latch1) for storing a second latched address 414, a third latch (Latch2) for storing a third latched address 416, and/or a fourth latch (Latch3) for storing a fourth latched address 418.

When the command address 402 does not match any of the latched addresses (e.g., at t1, t4, t7, and/or t9), the control circuit 300 (via, e.g., the refresh control logic 332) can update or replace one of the latched addresses with the new address. In some embodiments, the control circuit 300 can evaluate count values associated with instances of the primary counters 312a-312i connected to the corresponding latches. For example, the refresh control logic 332 can compare a first count value 422 of a first counter (Counter0) connected to the first latch, a second count value 424 of a second counter (Counter1) connected to the second latch, a third count value 426 of a third counter (Counter2) connected to the third latch, and a fourth count value 428 of a fourth counter (Counter3) connected to the fourth latch. Based on the evaluation, in some embodiments, the control circuit 300 can update store the new address at the latch that corresponds to the lowest counter value. In some embodiments, when more than one counters have the lowest count value, the control circuit 300 can select one of the corresponding latches according to a predetermined (e.g., cyclical) order.

Otherwise, when the command address 402 matches one of the latched addresses (e.g., at t2, t3, t5, t6, and/or t8), the control circuit (via, e.g., the refresh control logic 332, the comparators, and/or the counters) can update or increment the corresponding count value. For example, a first comparator connected to the row address bus 302 and the first latch can generate a first match signal 432 (CM0) based on comparing the command address 402 to the first latched address 412. Similarly, a second comparator can generate a second match signal 434 (CM1), a third comparator can generate a third match signal 436 (CM2), and a fourth comparator can generate a fourth match signal 438 (CM3) based on comparing the command address 402 to the second latched address 414, third latched address 416, and fourth latched address 418, respectively. In some embodiments, the comparators can generate a pulse when the compared addresses match. The match signals can be provided to the corresponding counters, which can increment the respective count values according to the match signal.

As an illustrative example, at t0, the first latch, the second latch, the third latch, and the fourth latch can respectively have the first latched address 412 of 'X0,' the second latched address 414 of 'X1,' the third latched address 416 of 'X2,' and the fourth latched address 418 of 'X3' as initially latched row addresses. When ACT is received at t1, the corresponding address value (e.g., 'X4') can be provided as the command address 402 on the row address bus 302. Since the address value 'X4' does not match (e.g., corresponding to the absence of pulses for the match signals 432-438) any of the previously latched addresses (e.g., 'X0,' 'X1,' 'X2,' and 'X3'), the refresh control logic 332 can issue a latch pulse to latch the new address 'X4.' Since all of the count values 422-428 are initialized to the same value (e.g., zero or one for up-counters), the refresh control logic 332 can issue the first latch pulse (L0) to update the first latch address 412 to the new address (e.g., from 'X0' to 'X4'). The control circuit 300 can further include circuitry to generate a corresponding clear signal (CLN) following the latch pulse. The clear signal can reset the corresponding counter and/or a match signal can update the counter. For example, the clear signal CLN0 can reset the first count value 422 to zero. In some embodiments, since the newly latched value (e.g., 'X4') is still on the row address bus 302, the first comparator can generate a pulse for the first match signal 432 and cause a chain of responses described above to update the first count value 422 to one.

At time t2, when a previously latched address of 'X1' (e.g., latched at the second latch address 414) is provided as the command address 402, the corresponding comparator (e.g., the second comparator) can generate a pulse for the match signal (e.g., the second match signal 434 (CM1)). The match signal can cause the corresponding counter (e.g., the second counter (Counted)) to increment the count value (e.g., increment the second count value 424 from one to two). Likewise, at time t3, the command address 402 matching the previously latched address of 'X3' can cause the third counter (Counter2) to increment the count value (e.g., increment the third count value 426 from one to two).

At time t4, when a new address of 'X5' is loaded/received as the command address 402, the comparators can remain steady since it does not match any of the latched addresses. Similar to time t1, the refresh control logic 332 can issue a latch pulse to latch the new address 'X5.' Although both the first counter and the third counter would have the lowest counter value of one, the refresh control logic 332 can issue the third latch pulse (L2) since the first latch pulse (L0) was previously issued when multiple counters had the same value. Accordingly, the third latch address 416 can be updated to the new address (e.g., from 'X2' to 'X5'). Further, the refresh control logic 332 can issue a corresponding clear signal CLN2 to reset the third count value 426 to zero, which can subsequently be updated to one via the third match signal 436 from the third comparator (i.e., since the row address bus 302 would still have the new address that has now been latched at the third latch (Latch2)).

For times t5, t6, and t8, the control circuit 300 can update/increment the corresponding count value (e.g., the first count value 422 and/or the third count value 426) similarly as described above for times t2 and t3 since the command address 402 matches the corresponding latched address (e.g., the first latch address 412 of 'X4' and/or the fourth latch address 418 of 'X3'). For times t7 and t9, the control circuit 300 can update one of the latch addresses (e.g., the third latch address 416 for the third latch (Latch2)) to the unlatched addresses (e.g., 'X0' and/or 'X5') similarly as described above for times t1 and t4.

Figure 5:
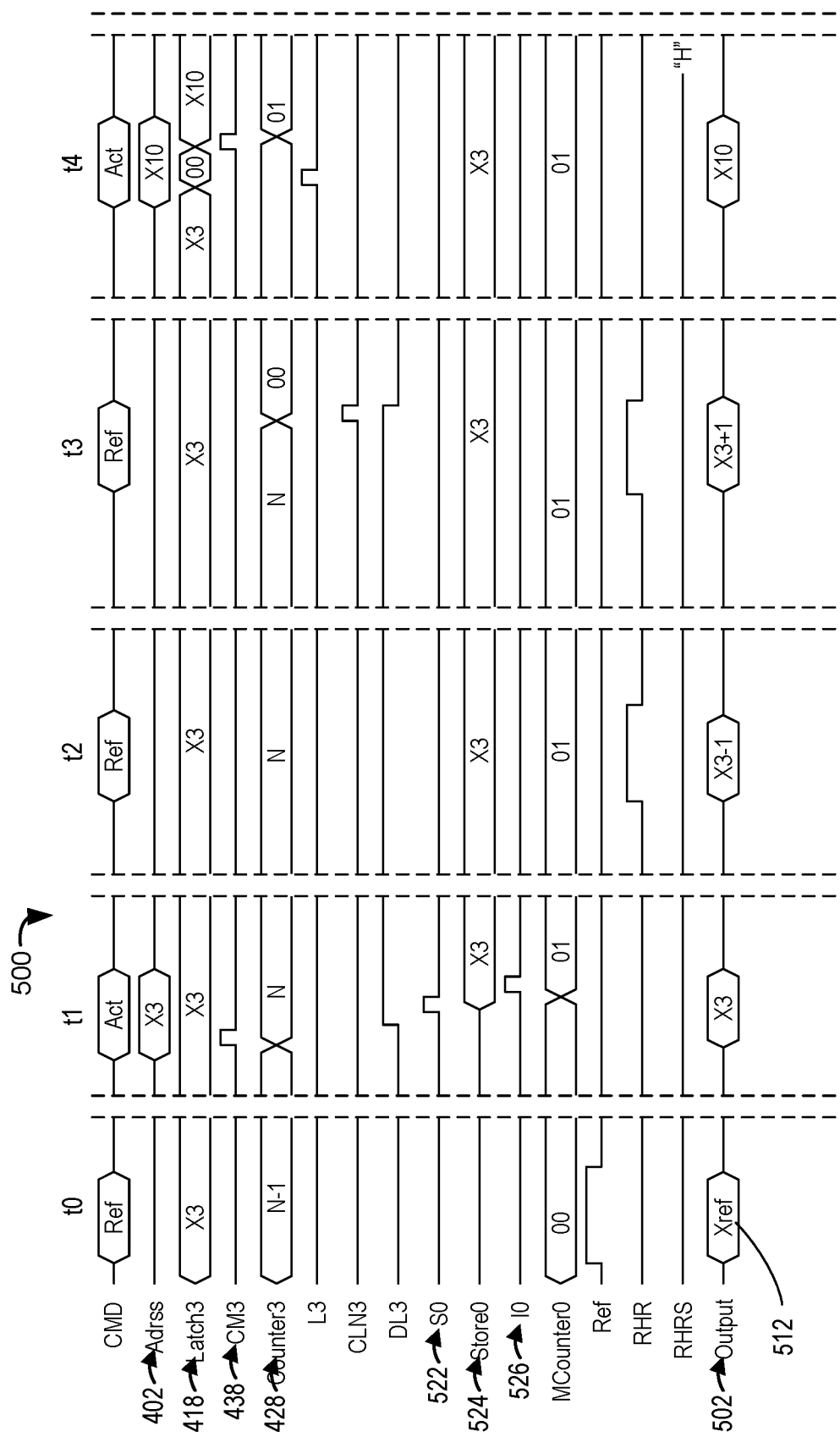
FIG. 5 is a timing diagram illustrating a row hammer refresh (RHR) triggering operation for an apparatus in accordance with an embodiment of the present technology.

FIG. 5 is a timing diagram 500 illustrating a row hammer refresh (RHR) triggering operation for an apparatus (e.g., the apparatus 100 of FIG. 1 and/or the control circuit 300 of FIG. 3 thereof) in accordance with an embodiment of the present technology. For illustration purposes, FIG. 5 illustrates an example scenario for the fourth counter (e.g., Counter3) connected to the fourth latch (Latch3) latching row address of 'X3.'

Time t0, FIG. 5 illustrates a condition when one of the count values (e.g., the fourth count value 428) for the primary counters 312a-312i of FIG. 3 is one below (e.g., 'N−1,' such as 9,999 for 'N' of 10,000) a primary RHR threshold 'N.' Since the count value has not reached the primary RHR threshold, the control circuit 300 can generate an address output 502 (e.g., address generated by the row-hammer multiplexer 328 of FIG. 3 and/or provided to the row decoder 140 of FIG. 1) as a CBR address 512 when a refresh command (REF) is received. The CBR address 512 can be the address generated by the refresh counter 304 of FIG. 3 for the scheduled refresh operation.

Subsequently, at time t1, the command address 402 on the row address bus 302 of FIG. 3 can match the latched address (e.g., the fourth latch address 418 of FIG. 4 of 'X3'). Accordingly, the fourth comparator can generate a match pulse for the fourth match signal 438, which can increment the fourth count value 428 to 'N.' Since one of the count values match the primary RHR threshold 'N,' the control circuit 300 can prepare to implement the RHR operation for the primary victim word lines 224 of FIG. 2 and/or update values for one or more components in the secondary RHR circuitry grouping.

For example, when the fourth count value 428 reaches 'N,' the refresh control logic 332 can activate or transition a buffer control signal (e.g., DL3) for one (e.g., the fourth instance) of the primary buffers 314a-314i connected to the fourth latch (Latch3). In response to the buffer control signal, the latched address (e.g., the fourth latch address 418) can be provided to the primary address calculator 316 of FIG. 3 via the primary row-hammer bus (e.g., N-bus). Accordingly, the primary RHR circuit grouping can determine one of the latched address (e.g., the fourth latch address 418) as the address for the aggressor word line 222 of FIG. 2 when the corresponding count value reaches the primary RHR threshold. In some embodiments, the address (e.g., 'X3') loaded on the primary row-hammer bus may be generated as the address output 502.

Also, for the secondary RHR circuitry grouping, the control circuit 300 can load the address of the aggressor word line 222 into one (e.g., a first storage circuit (Storage0)) of the row address storage circuits 318a-318j of FIG. 3. For loading the address, the refresh control logic 332 can issue a store signal (e.g., a first store signal (S0)) that corresponds to the selected storage circuit. For the illustrated example, the first store signal can load the address value of 'X3' (e.g., for the aggressor word line 222) into the first storage circuit. In some embodiments, the refresh control logic 332 can select the storage circuit similarly as described above for selecting the latches for storing the new and unlatched addresses. The refresh control logic 332 can further issue a first update signal 526 (I0) for incrementing one (e.g., MCounter0) of the secondary counters 322a-322j that correspond to (e.g., connected to) the first storage circuit.

At time t2, the received command can be the refresh command (Ref). In responding to the first refresh command after the counter value has reached the primary RHR threshold 'N,' the primary address calculator 316 can calculate and output one of the addresses for the primary victim word lines 224. For example, at t2, the primary address calculator 316 can output the address (e.g., 'X3−1' for the primary victim word line 'WLn−1') based on decreasing the address for the aggressor word line 222 (i.e., the value loaded on the primary row-hammer bus) by one. Further in response to the refresh command, the refresh control logic 332 can output a pulse for the RHR signal such that the row-hammer multiplexer 328 selects the output (e.g., 'X3−1') of the primary address calculator 316 as the address output 522.

At time t3, the received command can be the refresh command (Ref). In responding to the first refresh command after the counter value has reached the primary RHR threshold 'N,' the primary address calculator 316 can calculate and output remaining one of the addresses for the primary victim word lines 224. For example, at t3, the primary address calculator 316 can output the address (e.g., 'X3+1' for the primary victim word line 'WLn+1') based on increasing the address for the aggressor word line 222 (i.e., the value loaded on the primary row-hammer bus) by one. Further, the refresh control logic 332 can output a pulse for the RHR signal such that the row-hammer multiplexer 328 selects the output (e.g., 'X3+1') of the primary address calculator 316 as the address output 522

For illustrative purposes, the timing diagram 500 corresponds to embodiments (e.g., for LPDDR (mobile) DRAM devices) the refresh one address per one memory bank in response to the refresh command. However, it is understood that the apparatus 100 can operate differently. In some embodiments (e.g., DDR (commodity) DRAM devices), for example, the apparatus 100 can refresh two or more addresses per one memory bank in response to one refresh command.

At the end of time t3, the refresh control logic 332 can generate the clear signal (e.g., CLN3) connected to the latch (e.g., Latch3) that triggered the RHR operation. According to the clear signal, the corresponding count value (e.g., the fourth count value 428 of 'N' at Counter3) can be reset. Along with the clear signal, the refresh control logic 332 can deactivate or remove the buffer control signal (e.g., DL3) such that the latched address is removed from the primary address calculator 316 and the primary row-hammer bus (e.g., N-bus).

At time t4, the command address 402 on the row address bus 302 can be a new or unlatched address. The control circuit 300 can operate as described above (e.g., similar to the operations at time t7 for FIG. 4) and latch the new address at the latch (e.g., Latch3) that previously latched the address for the aggressor word line 222. For example, the control circuit 300 can latch the new address to Latch3 since the fourth count value 428 has been reset. Based on latching the new address, the control circuit 300 can increment the fourth count value 428 (e.g., to one).

Figure 6:
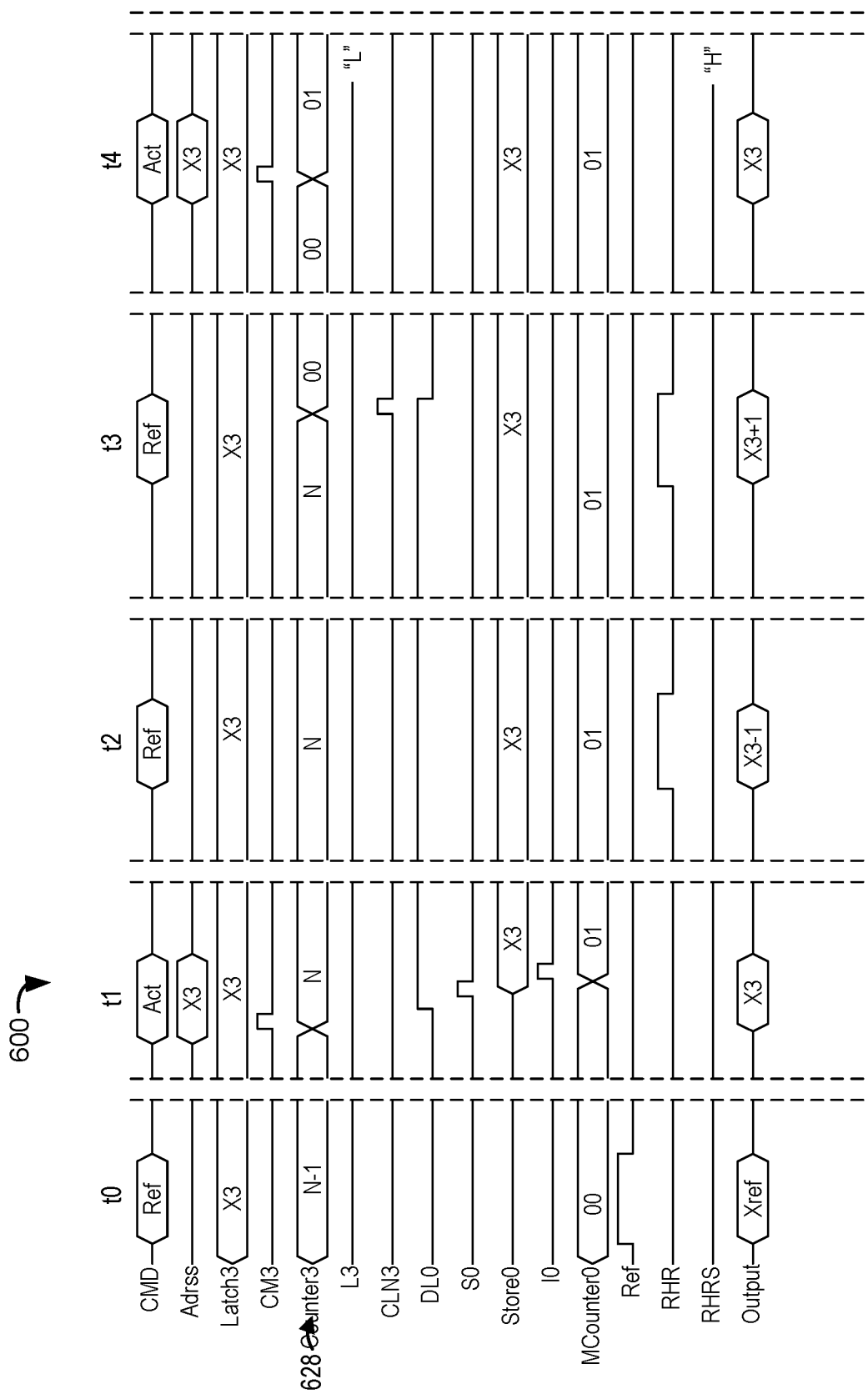
FIG. 6 is a further timing diagram illustrating a row hammer refresh (RHR) triggering operation for an apparatus in accordance with an embodiment of the present technology.

FIG. 6 is a further timing diagram 600 illustrating a row hammer refresh (RHR) triggering operation for an apparatus (e.g., the apparatus 100 of FIG. 1 and/or the control circuit 300 of FIG. 3 thereof) in accordance with an embodiment of the present technology. FIG. 6 illustrates operations of the control circuit 300 when the received address with the ACT command is same as the address that triggered the RHR operation. In comparing to the timing diagram 500 of FIG. 5, the timing diagram 600 include the same sequence of events/operations for times t0, t1, t2, and t3. Accordingly, at time t3, the control circuit 300 completes the RHR operation for the primary victim word lines 224 of FIG. 2 (e.g., addresses 'X3−1' and 'X3+1') for the aggressor word line 222 of FIG. 2 (e.g., address 'X3') that was latched in Latch3.

At time t4, the command address 402 on the row address bus 302 can be the same address ('X3') as the aggressor word line 222 associated with the previously implemented RHR operation. Since the address remains latched (e.g., at Latch3), the corresponding comparator can generate the match signal (e.g., CM3) and the corresponding counter (e.g., Counter3) can increment the count value (e.g., a fourth count value 628). Otherwise, the latching signal (e.g., L3) and/or the clear signal (e.g., CLN3) can remain undisturbed since the latched value also remains unchanged.

Figure 7:
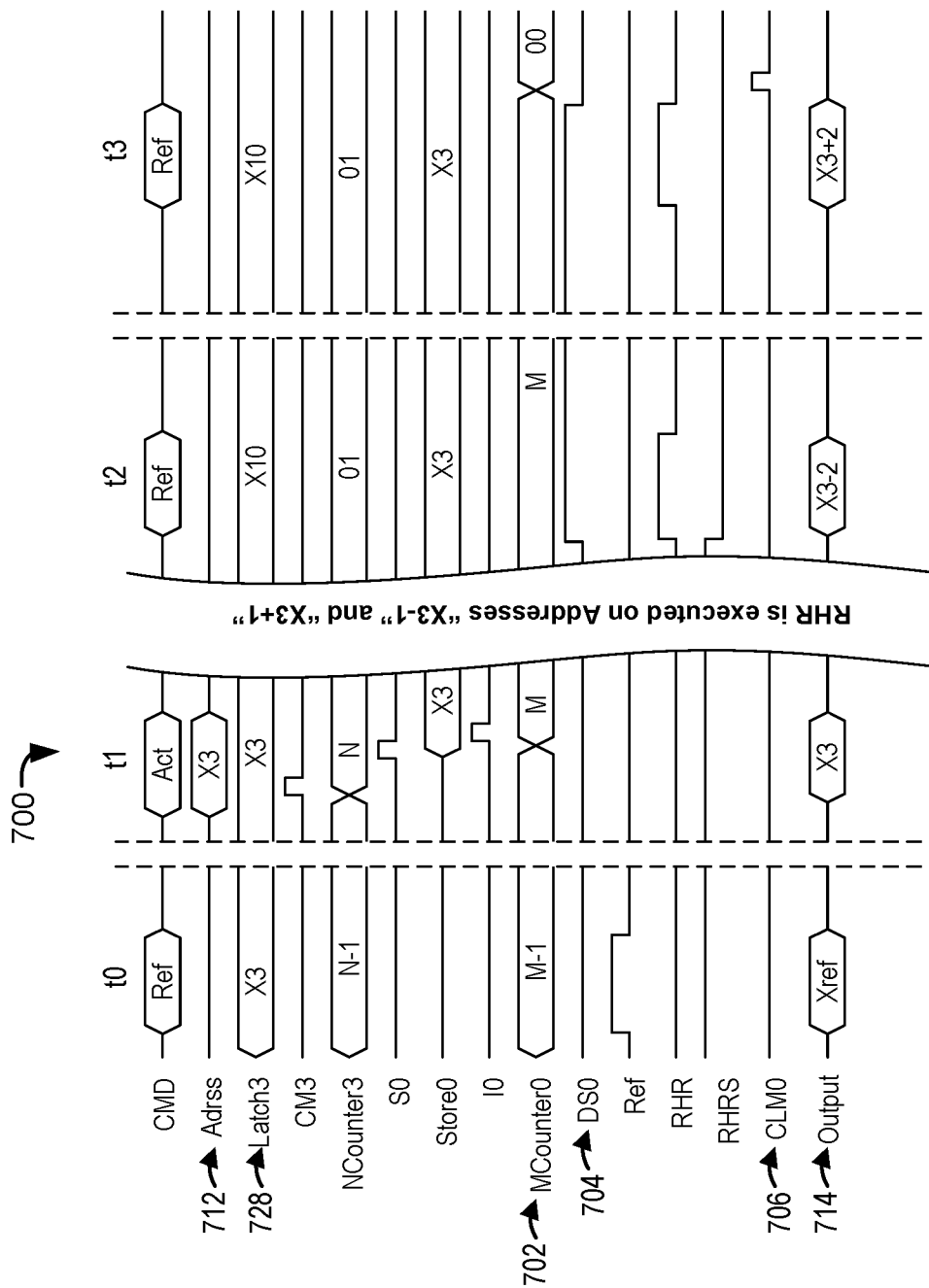
FIG. 7 is a timing diagram illustrating a row hammer refresh (RHR) triggering operation for secondary addresses for an apparatus in accordance with an embodiment of the present technology.

FIG. 7 is a timing diagram 700 illustrating a row hammer refresh (RHR) triggering operation for secondary addresses (e.g., for the secondary victim word lines 226 of FIG. 2) for an apparatus (e.g., the apparatus 100 of FIG. 1 and/or the control circuit 300 of FIG. 3 thereof) in accordance with an embodiment of the present technology. As described above, in some embodiments, the RH condition can affect word lines in addition to the word lines (e.g., the primary victim word lines 224 of FIG. 2) that are immediately adjacent to the aggressor word line 222 of FIG. 2. However, the degradation in the charges resulting from the RH condition is reduced as the physical distance between the affected word line and the aggressor word line 222 increases. Accordingly, the secondary RHR circuitry grouping can trigger the RHR operation for the secondary addresses based on a threshold (e.g., a secondary RHR threshold 'M') that is different than the threshold (e.g., the primary RHR threshold 'N') used to trigger the RHR operation for the primary (e.g., nearer) word lines.

For the example illustrated in FIG. 7, at time t0, the primary RHR circuit grouping can be in a state similar to t0 of FIG. 5 and FIG. 6. Accordingly, a fourth count value 728 corresponding to address 'X3' latched at a fourth latch (Latch3) can be immediately below (e.g., one less than, i.e., 'N−1') the primary RHR threshold 'N.'

As described above (e.g., for the example illustrated in FIG. 5), the control circuit 300 can track (via, e.g., the secondary counters 322a-322j of FIG. 3) the access of a word line and/or an occurrence of the RHR operation relative to the secondary victim word lines 226. In some embodiments, the control circuit 300 can increment the secondary counters each time the corresponding addresses (e.g., for the aggressor word lines 222) triggers the RHR operation. At time t0, a secondary count value 702 (e.g., an incremented value in one of the secondary counters 322a-322j, such as for a first counter (MCounter0)), can be immediately below (e.g., one less than, i.e., 'M−1') the secondary RHR threshold 'M.'

At time t1, a command address 712 (e.g., the address value on the row address bus 302 of FIG. 3) can match the latched address (e.g., 'X3'). Accordingly, the primary RHR circuit grouping can increment the fourth count value 728 to meet or satisfy the threshold value 'N,' thereby initiating the RHR operation to refresh the primary victim word lines 224 (e.g., for addresses 'X3-1' and "X3+1') surrounding the latched address.

Also, at time t1, the secondary RHR circuit grouping can process the RH condition. In some embodiments, the refresh control logic 332 of FIG. 3 can control or pulse a store signal (e.g., S0) for loading the received address (i.e., the latched address corresponding to the address of the aggressor word line 222) to one of the address storage circuits 318a-318j of FIG. 3 (e.g., Storage0). The refresh control logic 332 (via, e.g., one or more comparators and/or latches therein) can control or pulse an update signal (e.g., I0) to increment the corresponding counter (e.g. MCounter0), resulting the secondary count value 702 to meet or satisfy the secondary RHR threshold 'M.'

At time t2, the apparatus 100 can begin executing the RHR operation to refresh the secondary victim word lines 226 based on a refresh command (Ref). In some embodiments, between times t1 and t2, the apparatus 100 can execute the RHR operations to refresh the primary victim word lines 224 (e.g., for addresses 'X3-1' and 'X3+1'). For example, time t2 of FIG. 7 can occur after time t4 of FIG. 5. Accordingly, in some embodiments, the apparatus 100 can begin executing the RHR operation to refresh the secondary victim word lines 226 in response to the first refresh command received after completing the RHR operation for the primary victim word lines 224. In other embodiments, such as for commodity DRAM devices, the apparatus 100 can refresh both of the primary victim word lines 224 and/or both of the secondary victim word lines 226 in response to one refresh command. For example, in some embodiments, the apparatus 100 can steal two operating cycles based on the first refresh command received after one of the primary count values reaches the primary RHR threshold and refresh of the primary victim word lines 224 across the two stolen cycles. The apparatus 100 can steal two more operating cycles based on the next refresh command for refreshing the secondary victim word lines 226. In some other embodiments, the apparatus 100 can steal four cooperating cycles based on the first refresh command received after detecting the RH condition for refreshing both the primary victim word lines 224 and the secondary victim word lines 226 (e.g., refreshing total of four word lines).

To refresh the secondary victim word lines 226, the control circuit 300 can activate or transition a secondary buffer control signal 704 (e.g., DSO) to provide the address (e.g., 'X3') of the aggressor word line 222 from the address storage circuits (e.g., Store0) to the secondary address calculator 324 of FIG. 3 via the secondary row-hammer bus (M-bus). Based on the received address, the secondary address calculator 324 can calculate the secondary addresses (e.g., 'X3−2' and 'X3+2') of the secondary victim word lines 226. For example, the secondary address calculator 324 can calculate the secondary addresses based on incrementing the received address up and/or down by two. In some embodiments (e.g., LPDDR (mobile) DRAM), the control circuit 300 can generate an output signal 714 to include first of the secondary addresses (e.g., 'X3−2') in response to the received refresh command. To generate the corresponding output signal 714, the control circuit 300 can deactivate or transition the RHR selection (RHRS) signal such that the primary-secondary multiplexer 326 of FIG. 3 selects the output of the secondary address calculator 324 instead of the primary address calculator 316 of FIG. 3 used for refreshing the primary addresses. Also, the secondary address calculator 324 can activate or transition the RHR signal such that the row-hammer multiplexer 328 of FIG. 3 selects the output of the address calculators (e.g., the secondary address calculator 324) instead of the CBR address from the CBR counter 304 of FIG. 3.

At time t3, for the next-received refresh command, the apparatus 100 can finish executing the RHR operation to refresh the secondary victim word lines 226. Accordingly, the control circuit 300 can generate the output signal 714 to include second of the secondary addresses (e.g., 'X3+2'). Further, the refresh control logic 332 can remove the address (e.g., 'X3') of the aggressor word line 222 from the secondary row-hammer bus (M-bus) and the secondary address calculator 324, such as by deactivating or transitioning the secondary buffer control signal 7-4 (e.g., DSO). Further, after outputting the last of the addresses for the secondary victim word lines 226, the refresh control logic 332 can reset the secondary count value 702, such as by pulsing or controlling a secondary clear signal 706 (e.g., CLM0 corresponding to the MCounter0).

The control circuit 300 can further reset the counters (e.g., one or more of the primary counters 312a-312i and/or one or more of the secondary counters 322a-322j) when the corresponding victim addresses are refreshed during the scheduled refresh. For example, the control circuit 300 can update the corresponding NCounter and/or the MCounter when the addresses for the primary victim word lines 224 and/or the secondary victim word lines 226 match the output of the CBR counter 304 generated as the output signal 714. Accordingly, the control circuit 300 can track the access of word lines and refresh the primary and/or the secondary victim word lines when the number of access reaches corresponding thresholds before the primary and/or the secondary victim word lines are refreshed via the scheduled refresh operation.

Figure 8:
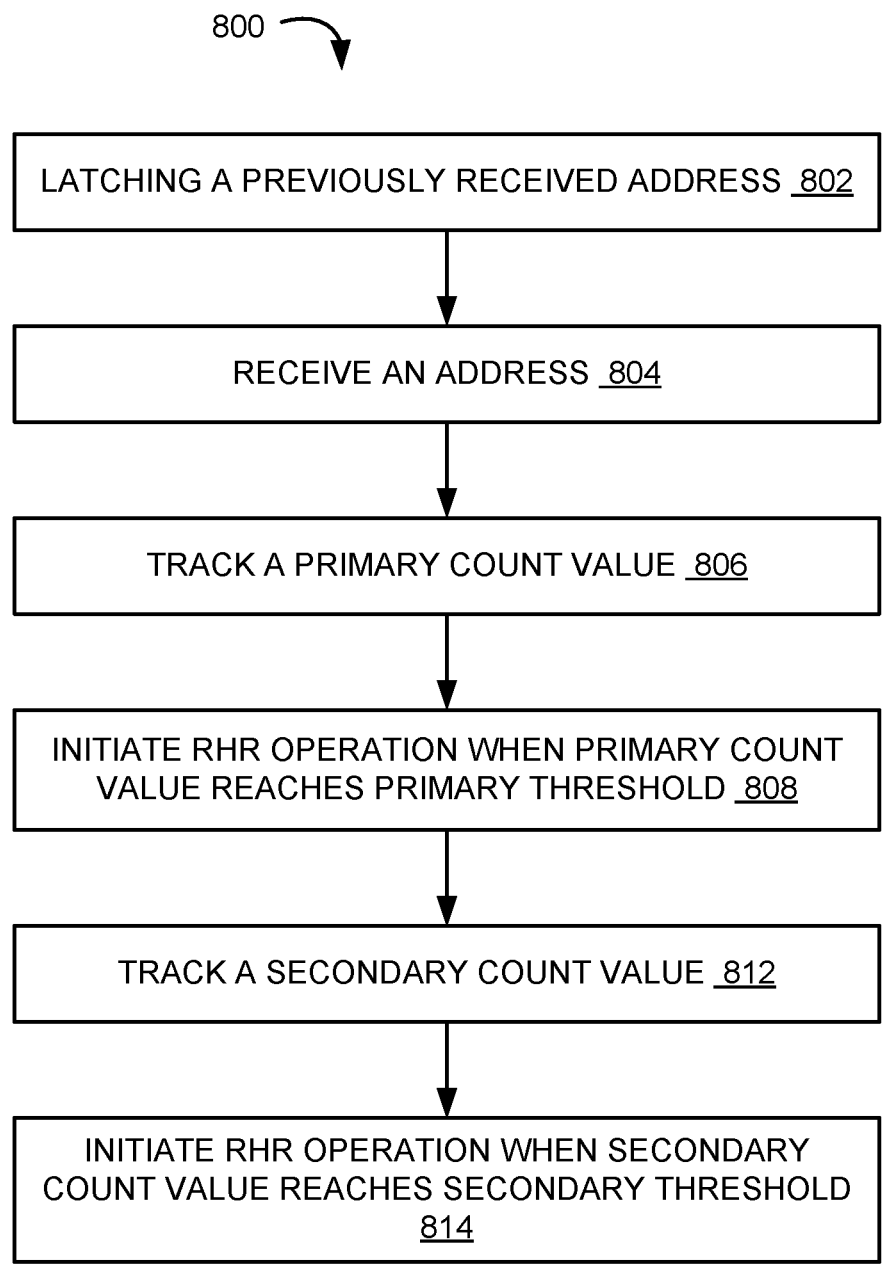
FIG. 8 is a flow diagram illustrating an example method of operating an apparatus in accordance with an embodiment of the present technology.

FIG. 8 is a flow diagram illustrating an example method 800 of operating an apparatus (e.g., the apparatus 100 of FIG. 1 or a portion therein) in accordance with an embodiment of the present technology. For example, the method 800 can be for operating the control circuit 300 of FIG. 3 as described above using example timing diagrams (e.g., the timing diagram 400 of FIG. 4, timing diagram 500 of FIG. 5, timing diagram 600 of FIG. 6, and/or timing diagram 700 of FIG. 7). The method 800 can be for refreshing the secondary victim word lines 226 of FIG. 2 in addition to primary victim word lines 224 of FIG. 2 in response to row hammer conditions.

At block 802, the apparatus 100 can latch a previously accessed address (e.g., one of the latch addresses illustrated in FIG. 4, such as the first latch address 412, the second latch address 414, the third latch address 416, and/or the fourth latch address 418). As described above, the apparatus 100 can latch the address that was received with a previous command when the previously accessed address failed to match one of the addresses latched at the time.

At block 804, the apparatus 100 can receive an address (e.g., the command address 402 of FIG. 2) that is accompanied by a command. The apparatus 100 can receive the address via the row address bus 302 of FIG. 3. The received address can be provided to various circuit components of the control circuit 300 of FIG. 3 for further processing.

At block 806, the apparatus 100 can track a primary count value when the received address matches the previously received address. For example, the processing circuit 300 (via, e.g., the primary circuit grouping) can determine whether the command address 402 matches one of the latched addresses. When there is a match, the processing circuit 300 can operate the counter connected to the matching latch and increment the corresponding count value.

At block 808, the apparatus 100 (via, e.g., the processing circuit 300) can initiate the RHR operation when the primary count value reaches the primary threshold. For example, based on comparing the primary count value to the primary threshold, the primary circuit grouping can determine a RH condition when the primary count value reaches the primary threshold. As described above, the primary circuit grouping can determine the aggressor word line 222 of FIG. 2 as the word line corresponding to the command address and generate an address output (e.g., the address output 502 of FIG. 2) that includes one or more addresses corresponding to the primary victim word lines 224 of FIG. 4. The address output can be passed to a row decoder and then to a memory array for refreshing (e.g., the RHR operation) the primary victim word lines 224.

At block 812, the apparatus 100 (via, e.g., the processing circuit 300) can track a secondary count value associated with the command address matching the previously accessed address. In some embodiments, as described above, the secondary circuit grouping can track the secondary count value based on storing the command address and/or operating one of the secondary counters to increment a count value that corresponds to the command address. In some embodiments, the secondary circuit grouping can increment the secondary count value when the RH is determined at the first circuit grouping and/or the RHR operation is initiated to refresh the primary victim word lines 224.

At block 814, the apparatus 100 (via, e.g., the processing circuit 300) can initiate the RHR operation when the secondary count value reaches the secondary threshold. For example, based on comparing the secondary count value to the secondary threshold, the secondary circuit grouping can determine a secondary refresh timing when the secondary count value reaches the secondary threshold. As described above, the secondary circuit grouping can determine the aggressor word line 222 associated with the RH condition that corresponds to the secondary refresh timing. The secondary circuit grouping can generate one or more addresses corresponding to the secondary victim word lines 226 of FIG. 2 as the output address. The output address can be passed to the row decoder and then to the memory array for refreshing (e.g., the RHR operation) the secondary victim word lines 226.

The secondary circuit grouping (e.g., the row address storage circuits 318, the secondary buffers 320, the secondary counters 322, the secondary address calculator 324, etc.) of the circuit control 300 provides increased data integrity and decreased errors. As the row hammer effect can degrade charges held in rows beyond the primary victim word lines 224, the secondary circuit grouping can track the access of the aggressor word line 222 with respect to the secondary victim word lines 226. Accordingly, the apparatus 100 can additionally refresh the secondary victim word lines 226 for appropriate conditions to offset the charge depletion caused by repeatedly accessing the aggressor word line 222.

Further, using the circuit control 300 described above, the apparatus 100 can apply different threshold/triggering conditions (e.g., the primary threshold and the secondary threshold) to control the timing and/or the frequency of executing the RHR operation for the secondary victim word lines 226. The secondary circuit grouping can adjust the timing and/or the frequency according to the reduced amount of degradation experienced by the secondary victim word lines 226 in comparison to the degradation experienced by the primary victim word lines 224. Accordingly, based on controlling the timing and/or the frequency, the secondary circuit grouping can further provide improved efficiency associated with refreshing the secondary victim word lines 226.

Figure 9:
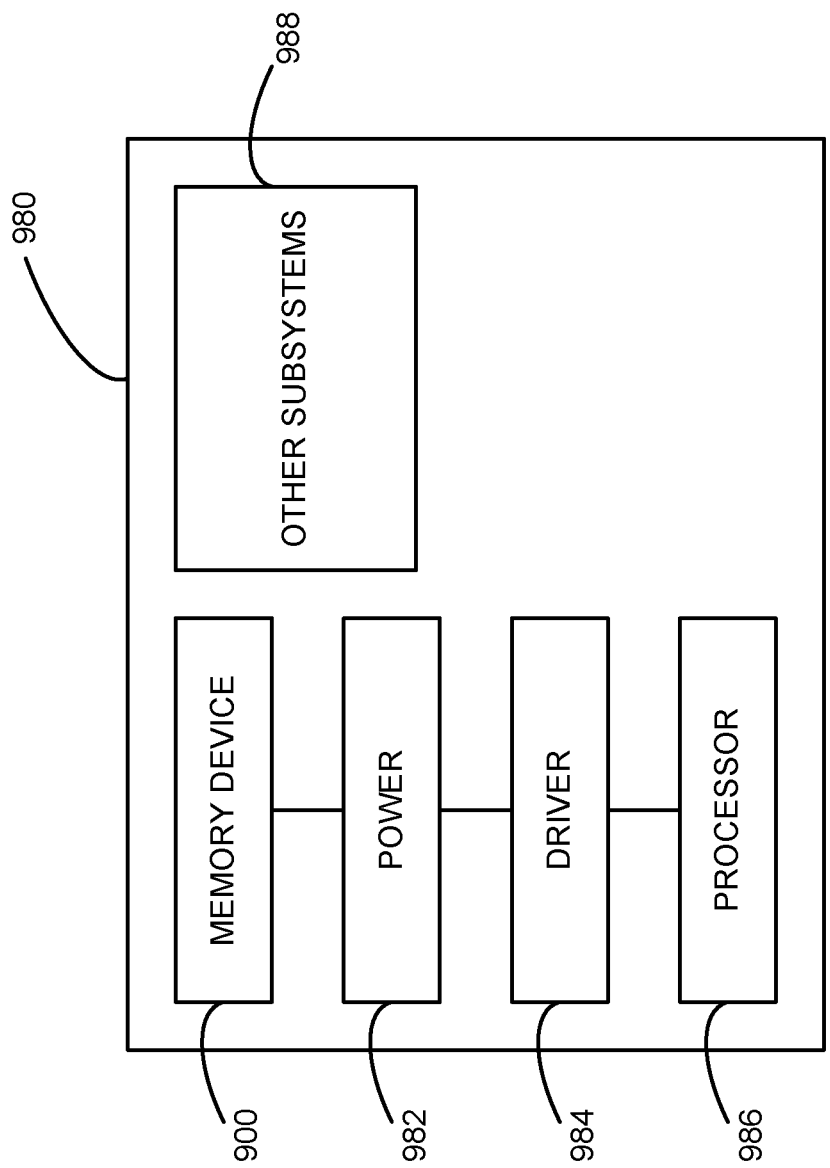
FIG. 9 is a schematic view of a system that includes an apparatus in accordance with an embodiment of the present technology.

FIG. 9 is a schematic view of a system that includes an apparatus in accordance with embodiments of the present technology. Any one of the foregoing apparatuses (e.g., memory devices) described above with reference to FIGS. 1-8 can be incorporated into any of a myriad of larger and/or more complex systems, a representative example of which is system 980 shown schematically in FIG. 9. The system 980 can include a memory device 900, a power source 982, a driver 984, a processor 986, and/or other subsystems or components 988. The memory device 900 can include features generally similar to those of the apparatus described above with reference to FIGS. 1-8, and can therefore include various features for performing a direct read request from a host device. The resulting system 980 can perform any of a wide variety of functions, such as memory storage, data processing, and/or other suitable functions. Accordingly, representative systems 980 can include, without limitation, hand-held devices (e.g., mobile phones, tablets, digital readers, and digital audio players), computers, vehicles, appliances and other products. Components of the system 980 may be housed in a single unit or distributed over multiple, interconnected units (e.g., through a communications network). The components of the system 980 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-9.

I claim:

1. An apparatus, comprising:
   an address bus configured to convey a command address accompanied by a command, wherein the command address identifies a word line to be activated, deactivated, or a combination thereof according to the command;
   a primary circuit grouping connected to the address bus, the primary circuit grouping including circuit components configured to:
   latch a previously accessed address,
   track a primary count value when the command address matches the previously accessed address, and
   calculate a primary address when the primary count value reaches a primary threshold, wherein the primary address represents a word line adjacent to the word line that is identified by the command address; and
   a secondary circuit grouping connected to the address bus, the secondary circuit grouping including circuit components configured to:
   track a secondary count value associated with the command address matching the previously accessed address, and
   calculate a secondary address when the secondary count value reaches a secondary threshold, wherein the secondary address represents a word line located farther from the word line identified by the command address than the word line represented by the primary address.

2. The apparatus of claim 1, further comprising:
   a memory array including memory cells each configured to store an amount of charge representing a data value, wherein the memory cells are arranged according to word lines; and
   a refresh circuit connected to the memory array and the primary and the secondary circuit groupings, the refresh circuit configured to refresh the memory cells according to the word lines for restoring the amount of charges stored in the memory cells, wherein
   the primary count value reaching the primary threshold corresponds to a row hammer condition that triggers the refresh circuits to refresh one or more rows associated with the command address.

3. The apparatus of claim 2, wherein:
   the word line identified by the command address corresponds to an aggressor word line;
   the primary circuit grouping includes a primary address calculator configured to calculate the primary address, wherein the word line the one or more word lines represented by the primary address correspond to a primary victim word line adjacent to the aggressor word line; and
   the secondary circuit grouping includes a secondary address calculator configured to calculate the secondary address, wherein the word line represented by the secondary address correspond to a secondary victim word line adjacent to the primary victim word line, wherein the primary victim word line is between the aggressor word line and the secondary victim word line.

4. The apparatus of claim 3, wherein:
   the primary address calculator is configured to calculate the primary address based on incrementing the command address by one value according to an addressing sequence that matches a physical arrangement of the word lines; and
   the secondary address calculator is configured to calculate the secondary address based on incrementing the command address by two values according to the addressing sequence.

5. The apparatus of claim 3, wherein the refresh circuit is configured to execute a row hammer refresh (RHR) operation to refresh the memory cells in the primary victim word line when the primary count value reaches the primary threshold, to refresh the memory cells in the secondary victim word line when the secondary count value reaches the secondary threshold, or a combination thereof.

6. The apparatus of claim 3, further comprising:
   a scheduled refresh (CBR) counter connected to the refresh circuit and configured to generate a scheduled refresh (CBR) address according to a schedule to refresh one or more of the word lines associated with the CBR address, wherein
   the primary circuit grouping is configured to reset the primary count value when the CBR address matches the primary address; and
   the secondary circuit grouping is configured to reset the secondary count value when the CBR address matches the secondary address.

7. The apparatus of claim 3, wherein the apparatus comprises a Dynamic Random-Access Memory (DRAM) device.

8. The apparatus of claim 7, wherein the apparatus comprises a mobile DRAM device.

9. The apparatus of claim 7, wherein the apparatus comprises a commodity DRAM device.

10. The apparatus of claim 1, wherein the primary and secondary count values are configured to control different refresh operations associated with the command address.

11. The apparatus of claim 1, wherein the secondary count value is updated according to a rate or a condition different from that for the primary count value.

12. An apparatus, comprising:
an address bus configured to convey a command address accompanied by a command, wherein the command address identifies a word line to be activated, deactivated, or a combination thereof according to the command;
a primary circuit grouping connected to the address bus, the primary circuit grouping including circuit components configured to:
latch a previously accessed address,
track a primary count value when the command address matches the previously accessed address, and
calculate a primary address when the primary count value reaches a primary threshold; and
a secondary circuit grouping connected to the address bus, the secondary circuit grouping including circuit components configured to:
track a secondary count value associated with the command address matching the previously accessed address, and
calculate a secondary address when the secondary count value reaches a secondary threshold,
wherein the secondary circuit grouping is configured to increment the secondary count value when the primary count value reaches a primary threshold.

13. A method of operating an apparatus, the method comprising:
latching a previously accessed address corresponding to a reference word line;
receiving a command address;
tracking a primary count value when the command address matches the previously accessed address, wherein the primary count value is associated with a primary word line adjacent to the reference word line;
tracking a secondary count value associated with the command address matching the previously accessed address, wherein the secondary count value is associated with a secondary word line farther from the reference word line than the primary word line; and
initiating a row hammer refresh (RHR) operation when the primary count value reaches a primary threshold, when the secondary count value reaches a secondary threshold, or a combination thereof.

14. The method of claim 13, wherein the primary and secondary values are configured to control different refresh operations associated with the command address.

15. The method of claim 13, further comprising:
calculating a primary address of the primary word line associated with the primary count value, wherein the one or more the primary word line correspond to a primary victim word line; and
calculating a secondary address of the secondary word line associated with the secondary count value, wherein the one or the secondary word line correspond to a secondary victim word line;
wherein initiating the RHR operation includes recharging the primary victim word line and/or the secondary victim word line according to the respective count values.

16. An apparatus, comprising:
an address bus configured to convey an address associated with a command, wherein the command address corresponds to a reference word line;
a tracking circuit coupled to the address bus, the tracking circuit configured to:
track a primary count value and a secondary count value when the address matches a previously accessed address,
calculate a primary address based on the primary count value, wherein the primary address represents a primary word line adjacent to the reference word line, and
calculate a secondary address based on the secondary count value,
wherein the secondary address represents a secondary word line physically located farther from the reference word line than the primary word line
wherein the primary count value and the secondary count values are configured to control corresponding refresh operations respectively associated with the primary address and the secondary address.

17. The apparatus of claim 16, wherein the tracking circuit is configured to reset the primary and/or the secondary count values according to a scheduled refresh address associated with an independently scheduled refresh operation.

18. An apparatus, comprising:
an address bus configured to convey an address associated with a command, wherein the command address corresponds to a word line;
a tracking circuit coupled to the address bus, the tracking circuit configured to:
track a primary count value and a secondary count value when the address matches a previously accessed address,
calculate a primary address based on the primary count value, and
calculate a secondary address based on the secondary count value,
wherein the primary count value and the secondary count values are configured to control corresponding refresh operations respectively associated with the primary address and the secondary address;
wherein the tracking circuit is configured to increment the secondary count value when the primary count value reaches a threshold.

19. An apparatus, comprising:
an address bus configured to convey an address associated with a command, wherein the command address corresponds to a word line;
a tracking circuit coupled to the address bus, the tracking circuit configured to:
track a primary count value and a secondary count value when the address matches a previously accessed address,
calculate a primary address based on the primary count value, and
calculate a secondary address based on the secondary count value,
wherein the primary count value and the secondary count values are configured to control corresponding refresh operations respectively associated with the primary address and the secondary address;

wherein:
the primary address corresponds to a primary victim word line receiving a primary effect from execution of the command involving the word line, and
the secondary address corresponds to a secondary victim word line receiving a secondary effect from execution of the command involving the word line, wherein the primary victim word line is between the secondary victim word line and the word line associated with the command.

20. The apparatus of claim 19, wherein:
the word line associated with the command comprises an aggressor word line;
the primary address represents the primary victim word line adjacent to the aggressor word line; and
the secondary address represents the secondary victim word line adjacent to the primary victim word line.

21. The apparatus of claim 19, further comprising:
a memory array including memory cells each configured to store an amount of charge representing a data value, wherein the memory cells are arranged according to word lines;
a refresh circuit connected to the memory array and the tracking circuit, the refresh circuit configured to restore the amount of charges stored in the memory cells associated with the primary and secondary victim word lines according to the respective primary and secondary count values.

* * * * *